(12) United States Patent
Im

(10) Patent No.: US 9,356,002 B2
(45) Date of Patent: May 31, 2016

(54) SEMICONDUCTOR PACKAGE AND METHOD FOR MANUFACTURING THE SAME

(71) Applicant: Yunhyeok Im, Hwaseong-si (KR)

(72) Inventor: Yunhyeok Im, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/706,096

(22) Filed: May 7, 2015

(65) Prior Publication Data

US 2015/0357269 A1 Dec. 10, 2015

(30) Foreign Application Priority Data

Jun. 10, 2014 (KR) .......................... 10-2014-0070278

(51) Int. Cl.
| | |
|---|---|
| *H01L 23/02* | (2006.01) |
| *H01L 25/065* | (2006.01) |
| *H01L 23/495* | (2006.01) |
| *H01L 23/00* | (2006.01) |
| *H01L 23/31* | (2006.01) |
| *H01L 23/373* | (2006.01) |
| *H01L 23/498* | (2006.01) |
| *H01L 25/10* | (2006.01) |

(52) U.S. Cl.
CPC ........ *H01L 25/0657* (2013.01); *H01L 23/3128* (2013.01); *H01L 23/3737* (2013.01); *H01L 23/49541* (2013.01); *H01L 23/49816* (2013.01); *H01L 24/17* (2013.01); *H01L 25/105* (2013.01); *H01L 23/49568* (2013.01); *H01L 2224/16057* (2013.01); *H01L 2224/16245* (2013.01); *H01L 2924/173* (2013.01); *H01L 2924/17724* (2013.01); *H01L 2924/17747* (2013.01)

(58) Field of Classification Search
CPC ...................... H01L 23/495; H01L 2224/1308; H01L 2225/1029; H01L 25/0657; H01L 2224/32145; H01L 23/3128; H01L 2225/06517
USPC .................. 257/666, 676, 686, 777, 787, 778
See application file for complete search history.

(56) References Cited

U.S. PATENT DOCUMENTS

| | | | |
|---|---|---|---|
| 7,195,957 B2 * | 3/2007 | Koon ...................... | H01L 25/50 257/685 |
| 7,667,308 B2 | 2/2010 | Do et al. | |
| 7,692,931 B2 | 4/2010 | Chong et al. | |
| 7,696,618 B2 | 4/2010 | Fan | |
| 7,843,047 B2 | 11/2010 | Kuan et al. | |
| 7,868,434 B2 | 1/2011 | Merilo et al. | |
| 7,986,043 B2 | 7/2011 | Merilo et al. | |
| 8,003,445 B2 | 8/2011 | Pagaila et al. | |
| 8,110,905 B2 | 2/2012 | Park et al. | |

(Continued)

FOREIGN PATENT DOCUMENTS

| | | |
|---|---|---|
| KR | 10-2012-0101886 A | 9/2012 |
| KR | 2013-0126306 A | 11/2013 |

*Primary Examiner* — S. V. Clark
(74) *Attorney, Agent, or Firm* — Lee & Morse, P.C.

(57) ABSTRACT

A semiconductor package includes a lower package including a lower substrate, a lower semiconductor chip, and a lower molding layer exposing an upper surface of the lower semiconductor chip, bumps on the lower substrate, the bumps being spaced apart from the lower semiconductor chip, a lead frame on the lower semiconductor chip and on the bumps, the lead frame being electrically connected to the bumps and having a thermal conductivity of about 100 W/mk to about 10,000 W/mk, and an upper package on the lead frame and electrically connected to the lead frame.

20 Claims, 15 Drawing Sheets

(56) References Cited

U.S. PATENT DOCUMENTS

| | | |
|---|---|---|
| 8,482,115 B2 | 7/2013 | Pagaila |
| 8,508,048 B2 * | 8/2013 | Honjo ................. H01L 25/16 257/685 |
| 8,803,299 B2 * | 8/2014 | Ong ................... H01L 23/3114 257/676 |
| 2004/0012096 A1 * | 1/2004 | Kim ................... H01L 25/105 257/777 |
| 2007/0278639 A1 * | 12/2007 | Bauer ................. H01L 25/0657 257/686 |
| 2009/0243069 A1 | 10/2009 | Camacho et al. |
| 2009/0261465 A1 * | 10/2009 | Shinagawa ........ H01L 23/49833 257/686 |
| 2011/0285009 A1 | 11/2011 | Chi et al. |
| 2012/0168917 A1 * | 7/2012 | Yim ..................... H01L 23/481 257/666 |

* cited by examiner

SEMICONDUCTOR PACKAGE AND METHOD FOR MANUFACTURING THE SAME

CROSS-REFERENCE TO RELATED APPLICATION

Korean Patent Application No. 10-2014-0070278, filed on Jun. 10, 2014, in the Korean Intellectual Property Office, and entitled: "Semiconductor Package and Method for Manufacturing the Same," is incorporated by reference herein in its entirety.

BACKGROUND

1. Field

The present disclosure herein relates to a semiconductor, and more particularly, to a semiconductor package and a method for manufacturing the same.

2. Description of the Related Art

With the development of electronic industry, lightweight, small, fast, and high performance electronic products are provided at low prices. According to the trend of such electronic industry, a semiconductor device technique for implementing a plurality of semiconductor chips or semiconductor packages as one package emerges. Various studies are required for improving the reliability of such semiconductor devices.

SUMMARY

The present disclosure provides a reliable semiconductor package by improving the heat dissipation characteristics of a semiconductor chip.

The present disclosure also provides a method for manufacturing a semiconductor package for easy electrical connection of a semiconductor package.

Embodiments provide a semiconductor package including a lower package including a lower substrate, a lower semiconductor chip, and a lower molding layer exposing an upper surface of the lower semiconductor chip, bumps on the lower substrate, the bumps being spaced apart from the lower semiconductor chip, a lead frame on the lower semiconductor chip and on the bumps, the lead frame being electrically connected to the bumps, and an upper package on the lead frame and electrically connected to the lead frame, a portion of the lead frame on the bumps being further recessed toward the lower substrate than a portion of the lead frame on the lower semiconductor chip.

In some embodiments, the lead frame may have a thermal conductivity of about 100 W/mk to about 10000 W/mk.

In other embodiments, the lead frame may include copper or aluminum.

In still other embodiments, the uppermost surface of the bumps may have a lower level than the upper surface of the lower semiconductor chip.

In even other embodiments, the lead frame may include a lead part for power supply and a lead part for signal transmission; the bumps may include a bump for power supply and a bump for signal transmission; and the lead part for power supply may be electrically connected to the bump for power supply and the lead part for signal transmission may be electrically connected to the bump for signal transmission.

In yet other embodiments, the upper package may include connection terminals provided on the lower surface thereof; and the lower package may include external terminals provided on the lower surface of the lower substrate, wherein the connection terminals may have a different arrangement than the external terminals from the two-dimensional viewpoint.

In further embodiments, the bumps may have a different arrangement than the connection terminals and the external terminals from the two-dimensional viewpoint.

In still further embodiments, the bumps may have a different pitch than the connection terminals from the two-dimensional viewpoint.

In even further embodiments, the packages may further include a heat release part disposed between the lower semiconductor chip and the lead frame.

In yet further embodiments, the packages may further include a support disposed between the lead frame and the upper package.

In yet further embodiments, the packages may further include a passive device unit disposed between the lower semiconductor chip and the lead frame or between the lead frame and the upper semiconductor chip.

In yet further embodiments, the lower molding layer may fill between the bumps and between the upper surface of the lower substrate and the lower surface of the lower semiconductor chip, on the upper surface of the lower substrate.

In other embodiments, a semiconductor package includes a lower package including a lower substrate, a lower semiconductor chip, bumps spaced apart from the lower semiconductor chip, and a lower molding layer, the lower molding layer being on a surface of the lower substrate and filling between the bumps on the surface of the lower substrate, and exposing an upper surface of the lower semiconductor chip, a lead frame on the lower semiconductor chip and on the bumps, the lead frame being electrically connected to the bumps, and an upper package on the lead frame and electrically connected to the lead frame, wherein the lead frame includes a lead part for power supply and a lead part for signal transmission, the bumps include a bump for power supply and a bump for signal transmission, and the lead part for power supply is electrically connected to the bump for power supply, and the lead part for signal transmission is electrically connected to the bump for signal transmission.

In some embodiments, the lead frame may include copper or aluminum.

In yet other embodiments, a semiconductor package includes a lower package including a lower substrate, a lower semiconductor chip, and a lower molding layer exposing an upper surface of the lower semiconductor chip, bumps on the lower substrate, the bumps being spaced apart from the lower semiconductor chip, a lead frame on the lower semiconductor chip and on the bumps, the lead frame being electrically connected to the bumps and having a thermal conductivity of about 100 W/mk to about 10,000 W/mk, and an upper package on the lead frame and electrically connected to the lead frame.

In other embodiments, the metal lead frame may include a first portion and a second portion peripheral to the first portion, a distance between a bottom surface of the first portion and a bottom of the lower substrate being larger than a distance between a bottom surface of the second portion and the bottom of the lower substrate.

In other embodiments, an arrangement of the bumps in the first molding layer may be different from an arrangement of connection terminals on a bottom surface of the upper package, when viewed from a two-dimensional top viewpoint.

In other embodiments, an arrangement of the bumps in the first molding layer may be different from an arrangement of external terminals on a bottom surface of the lower package, when viewed from a two-dimensional top viewpoint.

In other embodiments, the metal leaf frame may include a plurality of conductive wirings, the plurality of conductive wiring extending over the lower package and connecting between the bumps and corresponding connection terminals on a bottom surface of the upper package.

In other embodiments, the bumps and the corresponding connection terminals may be in a non-overlapping relationship.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1A:
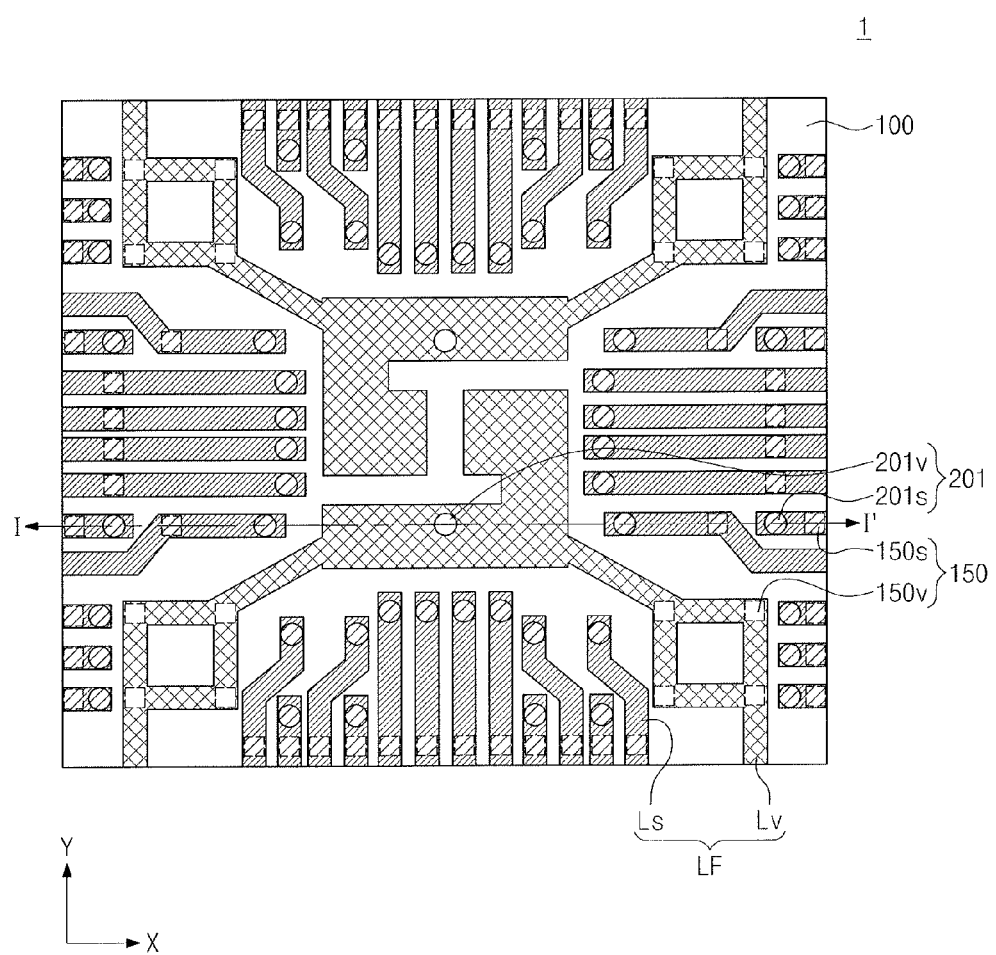
FIG. 1A illustrates a plan view of a semiconductor package according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

In the following description, the technical terms are used only for explaining specific embodiments without limiting. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Also, though terms like a first, a second, and a third are used to describe various regions and layers in various embodiments, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. Unless otherwise defined, the terms used herein, including technical or scientific terms, have the same meanings as generally understood by those skilled in the art.

Hereinafter, a semiconductor package according to embodiments is described.

Figure 1B:
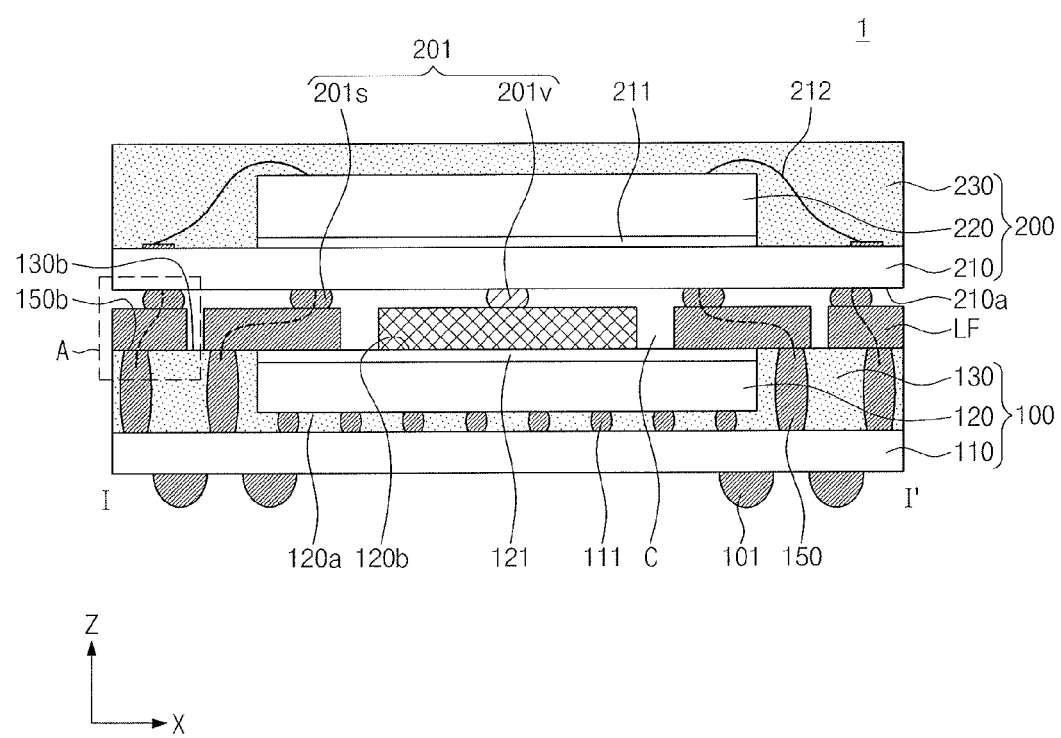
FIG. 1B illustrates a sectional view taken along line I-I' of FIG. 1A.

FIG. 1A is a plan view of a semiconductor package according to an embodiment. FIG. 1B is a sectional view taken along line I-I' of FIG. 1A.

Referring to FIGS. 1A and 1B, a semiconductor package 1 may include a lower package 100, bumps 150, a lead frame LF, and an upper package 200. A void C may be provided between the lead frame LF and the upper package 200.

The lower package 100 may include a lower substrate 110, a lower semiconductor chip 120, and a lower molding layer 130. The lower substrate 110 may be, e.g., a printed circuit board (PCB) having a circuit pattern. External terminals 101 may be disposed at a lower surface of the lower substrate 110. The external terminals 110 may include conductive material and may have a solder ball form. The lower substrate 110 may be electrically connected to an external device through the external terminals 101.

The lower semiconductor chip 120 may be mounted on the lower substrate 110, e.g., through a flip chip method. An upper surface 120b of the lower semiconductor chip 120 may be an active surface, and a lower surface 120a of the lower semiconductor chip 120 may be an inactive surface. Connection parts 111 may be disposed between the lower substrate 110 and the lower surface 120a of the lower semiconductor chip 120. The lower semiconductor chip 120 may be electrically connected to the lower substrate 110 through the connection parts 111. The lower semiconductor chip 120 may include an integrated circuit, e.g., a memory circuit, a logic circuit, or a combination thereof.

The lower molding layer 130 may fill between the bumps 150 on the lower substrate 110. The lower molding layer 130 may cover a side surface of the lower semiconductor chip 120 but may not cover the upper surface 120b of the semiconductor chip 120, i.e., the lower molding layer 130 may expose the upper surface 120b of the semiconductor chip 120. For example, an uppermost surface 130b of the lower molding layer 130 may be identical to, e.g., level with, or lower than the upper surface 120b of the lower semiconductor chip 120. For example, the lower molding layer 130 may further extend between the lower substrate 110 and the lower semiconductor chip 120, and may fill between the connection parts 111. In another example, an underfill layer (not shown) may be provided between the lower substrate 110 and the lower semiconductor chip 120, as well as between the connection parts 111. The lower molding layer 130 may include an insulating polymer material, e.g., an epoxy molding compound.

The bumps 150 may be horizontally spaced apart from the lower semiconductor chip 120 on the lower substrate 110. The bumps 150 may be disposed between the lower substrate 110 and the lead frame LF, e.g., along a z direction. The bumps 150 may include conductive material. As shown in FIG. 1A, the bumps 150 may include a bump 150s for signal transmission and a bump 150v for power supply. An uppermost surface 150b of the bumps 150 may substantially have a same level as the upper surface 120b of the lower semiconductor chip 120. The bumps 150 may be spaced apart from each other side by side, i.e., the bumps 150 may be spaced apart from each other along a horizontal direction. The lower molding layer 130 may be disposed between adjacent bumps 150, and thus, the bumps 150 may not be electrically connected to each other. Accordingly an electrical short circuit may be prevented from the semiconductor package 1. From a two-dimensional viewpoint, i.e., when viewed from a top view, e.g., in an x-y plane, the bumps 150 may have a different arrangement and pitch than the external terminals 101.

The lead frame LF may be disposed between the lower package 100 and the upper package 200. The lead frame LF may be disposed on the upper surface 120b of the lower semiconductor chip 120 and on the bumps 150, and may electrically connect the upper package 200 to the lower semiconductor chip 120 and to the bumps 150. During driving of the semiconductor package 1, heat generated from the lower semiconductor chip 120 may be discharged to the outside through the lead frame LF.

In detail, the lead frame LF may have a thermal conductivity of about 100 W/mk to about 10,000 W/mk. The lead frame LF may include metal, e.g., copper or aluminum. In contrast, an interposer substrate including an organic material may have a thermal conductivity of about 5 W/mk to about 30 W/mk. Therefore, the lead frame LF may have a thermal resistance that is lower by about 5% to about 9% than that of an interposer substrate formed of an organic material, an interposer substrate formed of a ceramic material, and a printed circuit board. Therefore, according to embodiments, since the thermal release characteristics of the lower semiconductor chip 120 are improved by the lead frame LF, the reliability of the semiconductor package 1 may be improved.

The lower molding layer 130 may have a relatively low heat coefficient. As the lower molding layer 130 does not cover the upper surface 120b of the lower semiconductor chip 120, heat generated from the lower semiconductor chip 120 may be transferred more smoothly toward the lead frame LF. For example, the lower semiconductor chip 120 may further include a heat transfer material layer 121, e.g., a thermal interface material (TIM), thereon. The heat transfer material layer 121 may include polymeric materials and conductive particles dispersed in the polymeric materials. Heat generated from the lower semiconductor chip 120 may be transferred more smoothly toward the lead frame LF by the heat transfer material layer 121. In another example, the heat transfer layer 121 may be omitted.

The upper package 200 may be provided on the lead frame LF. The upper package 200 may include an upper substrate 210, an upper semiconductor chip 220, and an upper molding layer 230. The upper substrate 210 may be, e.g., a PCB. Connection terminals 201 may be provided on a lower surface 210a of the upper substrate 210. The connection terminals 201 include a connection terminal 201v for power supply and a connection terminal 201s for signal transmission. The connection terminals 201 may have a different arrangement and pitch than the above-mentioned bumps 150, as viewed from a top view. The connection terminals 201 may have a different arrangement and pitch than the external terminals 101 of the lower package 100, as viewed from a top view.

Hereinafter, an electrical connection of the semiconductor package 1 will be described in more detail.

Referring to FIGS. 1A and 1B, the lead frame LF may include a plurality of lead parts Lv and Ls. For example, the lead parts Lv and Ls may include a plurality of lead parts Lv for power supply (cross-hatched portions) and a plurality of lead parts Ls for signal transmission (hatched portions). For example, as illustrated in FIGS. 1A and 1B, the plurality of lead parts Lv and lead parts Ls may be a plurality of flat conductive wires arranged in predetermined patterns, as will be described in detail below. The plurality of lead parts Lv and lead parts Ls may include a same material and have a same structure, and may be different from each other only by connection, i.e., whether connected to transmit signals or power.

For example, from a two-dimensional top view, the lead part Lv for power supply is formed at a position corresponding to a core, e.g., center, of the lead frame LF, and the lead part Ls for signal transmission may be disposed surrounding the lead part Lv for power supply. For example, as illustrated in FIGS. 1A-1B, the lead part Lv of the lead frame LF may include a central conductive material overlapping a top of the lower semiconductor chip 120 and connecting the lower semiconductor chip 120 to the connection terminals 201 of the upper package 200 (FIG. 1B), and may include conductive portions extending from the central conductive material toward peripheral power supply bumps 150v (FIG. 1A). For example, as illustrated in FIGS. 1A-1B, the lead part Ls of the lead frame LF may include a plurality of conductive strips surrounding the central conductive material of the lead part Lv (FIG. 1A), and may connect the bumps 150 to the connection terminals 201 of the upper package 200 (FIG. 1B). However, the arrangement of the lead parts Lv and Ls is not limited to the above and may vary.

If the lead fame LF were to be omitted, the connection terminals 201 of the upper package 200 would have to be formed directly above the bumps 150 for proper connection. Therefore, from a two-dimensional top viewpoint, the connection terminals 201 would have to have a same arrangement as the bumps 150, i.e., the connection terminals 201 would have to have a same position and pitch as the bumps 150 to provide a one-to-one correspondence. Alternatively, the connection terminals 201 and the bumps 150 formed by separate processes may be omitted and connection bumps (not shown) formed by a single process may be used to connect the lower and upper packages 100 and 200. As such, the arrangement and electrical connection between the lower and upper packages 100 and 200 through the connection terminals 201 and bumps 150 would have been limited.

In contrast, according to embodiments, the lead frame LF provides electrical connection between the connection terminals 201 and bumps 150 without necessitating a same arrangement therebetween. That is, as shown by the dotted line in FIG. 1B, the connection terminals 201 may be electrically connected to the bumps 150 through the lead frame LF. For example, as illustrated in FIG. 1A, the connection terminal 201v for power supply may be electrically connected to one bump 150v (or multiple bumps 150v) for power supply through the lead part Lv for power supply, and the connection terminal 201s for signal transmission may be electrically connected to the bump 150s for signal transmission through the lead part Ls for signal transmission. The connection terminals 201 may have a different arrangement and pitch than the bumps 150 by the lead frame LF. The restrictions on the arrangement of the connection terminals 201 and the bumps 150 may be reduced. Accordingly, a circuit configuration in the lower substrate 110 and the upper substrate 210 may be more varied.

Figure 2A:
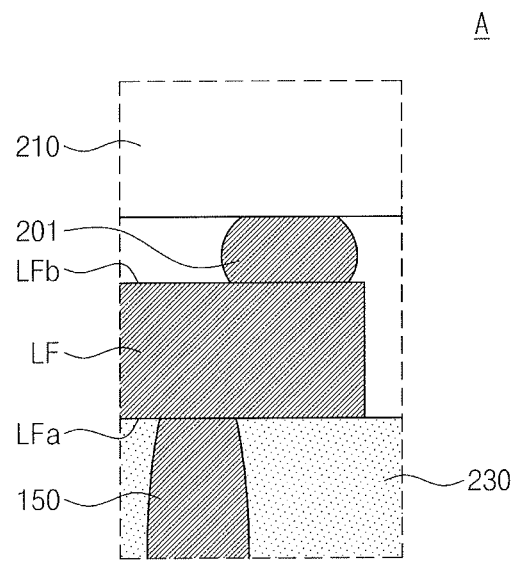
FIGS. 2A and 2B illustrate enlarged views of area A of FIG. 1B.
Figure 2B:
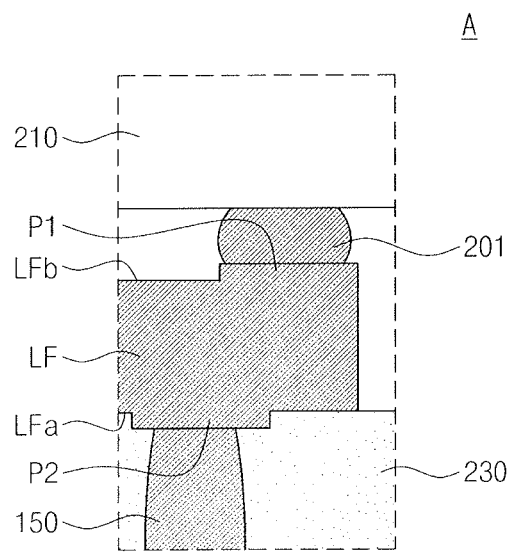

FIGS. 2A and 2B are enlarged exemplary sectional views of portion A of the lead frame LF in the semiconductor package 1 according to embodiments.

For example, referring to FIG. 2A, an upper surface LFb and a lower surface LFa of the lead frame LF may be flat. In this case, the connection terminals 201 may contact the upper surface LFb of the lead frame LF, and the bumps 150 may contact the lower surface LFa of the lead frame LF.

In another example, referring to FIG. 2B, a first protruding part P1 may be provided on the upper surface LFb of the lead frame LF, and a second protruding part P2 may be provided on the lower surface LFa of the lead frame LF. One of the connection terminals 201 may contact the first protruding part P1, and one of the bumps 150 may contact the second protruding part P2. Accordingly, the connection terminals 201 may be electrically connected to the bump 150 through the lead frame LF.

When the protruding parts P1 and P2 are further provided on the lead frame LF, the connection terminals 201 and the lead frame LF, and the bumps 150 and the lead frame LF may have improved contact. For example, the protruding parts P1 and P2 may be formed through patterning of the lead frame LF, e.g., an etching process. In another example, the protruding parts P1 and P2 may be formed through a coining process. In yet another example, the protruding parts P1 and P2 may be formed by applying physical pressure on the lead frame LF and then bending the lead frame LF. In yet another example, one of the first protruding part P1 and the second protruding part P2 may be omitted.

Referring to FIG. 1B again, the upper semiconductor chip 220 may be mounted on the upper substrate 210 through a bonding wire 212. For example, an adhesive layer 211 may be disposed between the upper substrate 210 and the upper semiconductor chip 220. In another example, the upper semiconductor chip 220 may be mounted on the upper substrate 210 through a flip chip bonding method. The upper semiconductor chip 220 may include an integrated circuit, e.g., a memory circuit. The upper molding layer 230 may cover the upper semiconductor chip 220 on the upper substrate 210.

Figure 3:
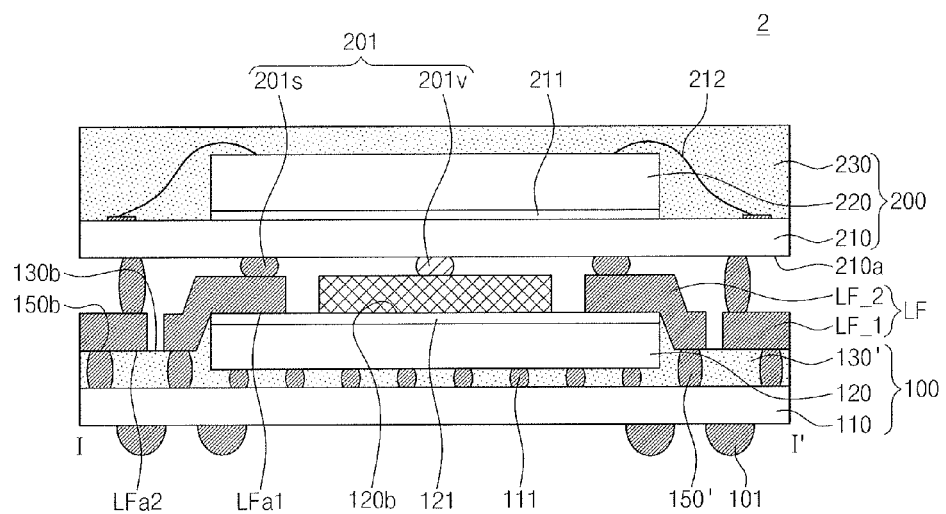
FIG. 3 illustrates a sectional view of a semiconductor package according to another embodiment.

FIG. 3 is a sectional view of a semiconductor package according to another embodiment. Hereinafter, details of the same elements described above are omitted.

Referring to FIG. 3, a semiconductor package 2 may include the lower package 100, bumps 150', a lead frame LF', and the upper package 200. The external terminals 101 may be disposed at the lower surface of the lower substrate 110. The external terminals 101 may have a different arrangement and pitch than the bumps 150'. The external terminals 101 may be electrically connected to the bumps 150' through the lower substrate 110. The lower semiconductor chip 120 may be electrically connected to the lower substrate 110 through the connection parts 111.

The lead frame LF' may be provided on the lower semiconductor chip 120 and the bumps 150'. Heat generated from the lower semiconductor chip 120 may be released through the lead frame LF'. The lower semiconductor chip 120 may further include the heat transfer material layer 121 thereon. For example, as shown in FIG. 2B, the lead frame LF may have protruding parts P1 and P2. In another example, as shown in FIG. 2A, the protruding parts P1 and P2 may not be provided.

Referring back to FIG. 3, a first portion LF_1 of the lead frame LF' on the bumps 150' may be further recessed toward the lower substrate 110 than a second portion LF_2 of the lead frame LF' on the lower semiconductor chip 120. For example, a lower surface LFa2 of the lead frame LF' on the bumps 150' may have a lower level than a lower surface LFa1 of the lead frame LF' on the lower semiconductor chip 120. That is, as illustrated in FIG. 3, a distance between an upper surface of the lower substrate 110 and the lower surface LFa2 of the lead frame LF' may be smaller than a distance between the upper surface of the lower substrate 110 and the lower surface LFa1 of the lead frame LF' on the lower semiconductor chip 120. As such, sizes of the bumps 150' may be reduced as compared to the bumps 150 in FIGS. 1A-1B, in order to allow the lower first portion LF_1 of the lead frame LF', and to allow the uppermost surface 150b of the bumps 150' to have a lower level than the upper surface 120b of the lower semiconductor chip 120.

Therefore, the pitches of the bumps 150' may become narrower. The bumps 150' having a narrow pitch may be diversely disposed on the lower substrate 110. An integrated circuit may be more easily configured in the lower substrate 110. A lower molding layer 130' may be disposed between the bumps 150' on the lower substrate 110. An electrical short circuit may be prevented between the bumps 150' by the lower molding layer 130'.

The lower molding layer 130' may fill between the bumps 150' on the lower substrate 110. The lower molding layer 130' may cover a side surface of the lower semiconductor chip 120 but may not cover the upper surface 120b of the semiconductor chip 120. The uppermost surface 130b of the lower molding layer 130 may be identical to or lower than the upper surface 120b of the lower semiconductor chip 120. As the sizes of the bumps 150' are reduced, the lower molding layer 130' may have a portion with a lower upper surface on the bumps 150' than the uppermost surface 130b.

The upper package 200 may include the upper substrate 210, the upper semiconductor chip 220, and the upper molding layer 230. The connection terminals 201 may be disposed on the lower surface of the upper substrate 210. From the two-dimensional top viewpoint, the connection terminals 201 may have a different arrangement and pitch than the bumps 150'.

Figure 4:
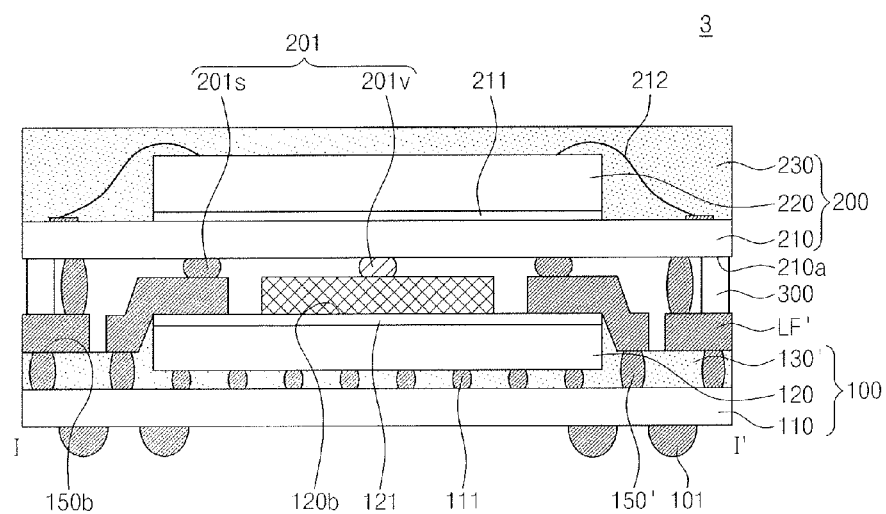
FIG. 4 illustrates a sectional view of a semiconductor package according to another embodiment.

FIG. 4 is a sectional view of a semiconductor package according to another embodiment. Hereinafter, overlapping contents described above are omitted.

Referring to FIG. 4, a semiconductor package 3 may include the lower package 100, the bumps 150', the lead frame LF', and the upper package 200. The lower package 100, the bumps 150', and the upper package 200 may be substantially identical to those described with reference to FIG. 1A-3. The lead frame LF' may be identical to that described with reference to FIG. 3. For example, a portion of the lead frame LF' on the bumps 150' may be further recessed toward the lower substrate 110 than a portion of the lead frame LF on the lower semiconductor chip 120. The uppermost surface 150b of the bumps 150 may substantially have a lower level than the upper surface 120b of the lower semiconductor chip 120. Therefore, the sizes and pitches of the bumps 150 may be reduced.

As illustrated in FIG. 4, a support 300 may be disposed between the lead frame LF' and the upper substrate 210. The support 300 may increase stability of the upper package 200 on the lower package 100. During a manufacturing process of the semiconductor package 3, the support 300 may prevent the bumps 150' or the connection terminals 201 from being damaged by a physical pressure.

Figure 5:
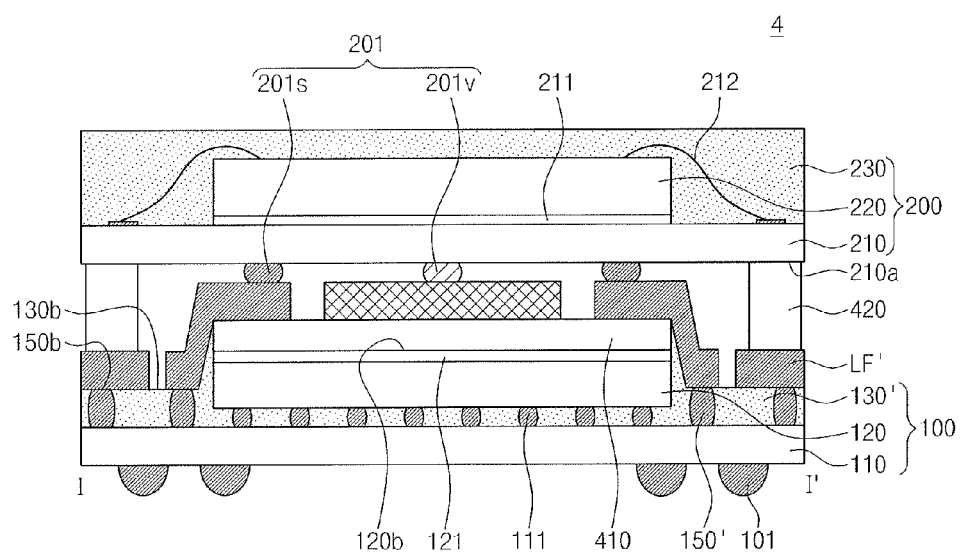
FIG. 5 illustrates a sectional view of a semiconductor package according to another embodiment.

FIG. 5 is a sectional view of a semiconductor package according to another embodiment. Hereinafter, overlapping contents described above are omitted.

Referring to FIG. 5, a semiconductor package 4 may include the lower package 100, the bumps 150', the lead frame LF', and the upper package 200. The lower package 100, the bumps 150', and the upper package 200 may be substantially identical to those described with reference to FIGS. 1A-3. The lead frame LF' may be substantially identical to that described with reference to FIG. 3. For example, a portion of the lead frame LF' on the bumps 150' may be further recessed toward the lower substrate 110 than a portion of the lead frame LF' on the lower semiconductor chip 120.

A first heat transfer unit 410 may be disposed between the lower semiconductor chip 120 and the lead frame LF'. Heat generated from the lower semiconductor chip 120 may be transferred more easily toward the lead frame LF' by the first heat transfer unit 410. A second heat transfer unit 420 may be disposed between the lead frame LF' and the upper substrate 210. Heat generated from the lower semiconductor chip 120 may be discharged to the second heat transfer unit 420 through the lead frame LF'. Further, heat generated from the upper package 200 may be discharged to the lead frame LF' through the second heat transfer unit 420. Each of the first and second heat transfer units 410 and 420 may include at least one of a heat slug, a thermal electric cooler (TEC), and a heat transfer material (for example, TIM) layer. The first heat transfer unit 410 may be the same type as or a different type from the second heat transfer unit 420. For another example, one of the first transfer unit 410 and the second heat transfer unit 420 may be omitted.

Figure 6:
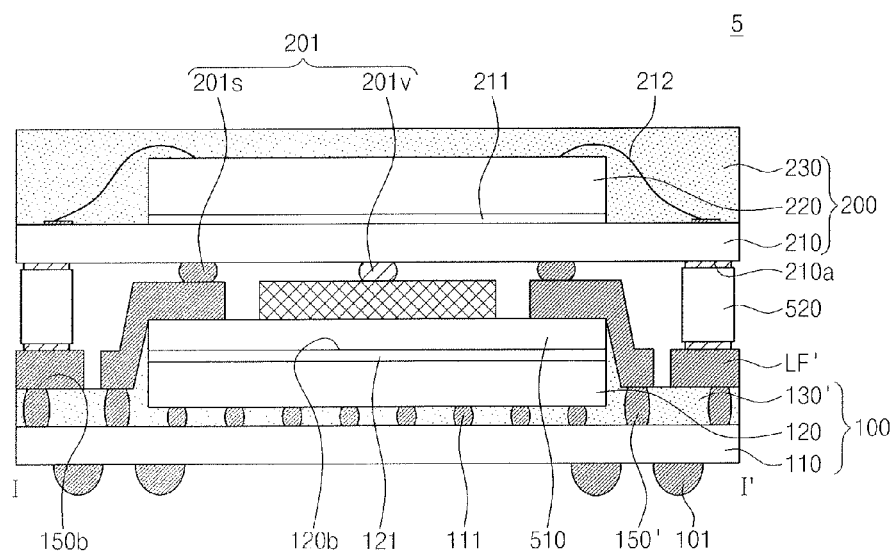
FIG. 6 illustrates a sectional view of a semiconductor package according to another embodiment.

FIG. 6 is a sectional view of a semiconductor package according to another embodiment. Hereinafter, overlapping contents described above are omitted.

Referring to FIG. 6, a semiconductor package 5 may include the lower package 100, the bumps 150', the lead frame LF', and the upper package 200. A portion of the lead frame LF' on the bumps 150' may be further recessed toward the lower substrate 110 than a portion of the lead frame LF' on the lower semiconductor chip 120. The uppermost surface 150b of the bumps 150' may have a lower level than the upper surface 120b of the lower semiconductor chip 120.

A first passive device unit 510 may be disposed between the lower semiconductor chip 120 and the lead frame LF'. A second passive device unit 520 may be disposed between the lead frame LF' and the upper substrate 210. The second passive device unit 520 may be electrically connected to the lead frame LF' and/or the upper substrate 210. The first and second passive device units 510 and 520 may include at least one of, e.g., a capacitor, a resistor, and an inductor. The first passive device unit 510 may be the same type as or a different type from the second passive device unit 520. For another example, one of the first passive device unit 510 and the second passive device unit 520 may be omitted.

Hereinafter, a method of manufacturing a semiconductor package according to embodiments is described.

Figure 7A:
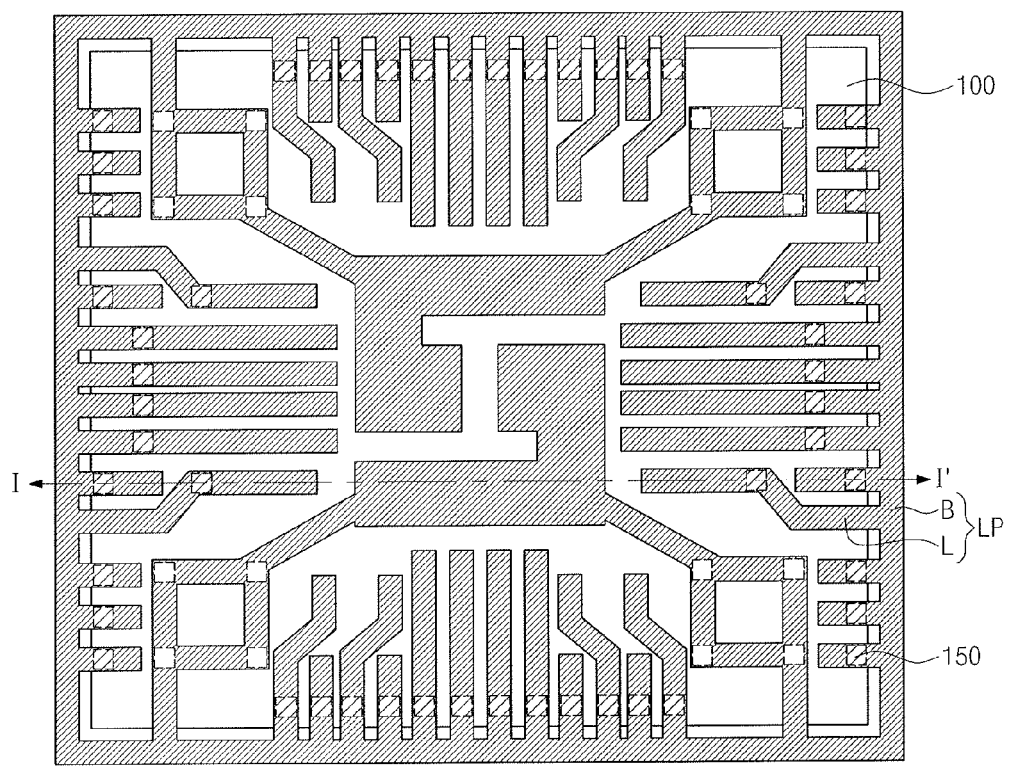
FIGS. 7A and 8A illustrate plan views of stages in a manufacturing process of a semiconductor package according to an embodiment.
Figure 7B:
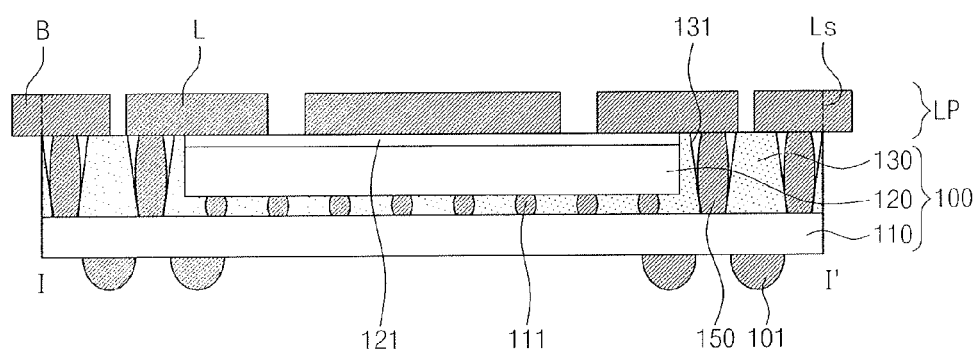
FIGS. 7B and 8B illustrate sectional views taken along lines I-I' of FIGS. 7A and 8A, respectively.
Figure 8A:
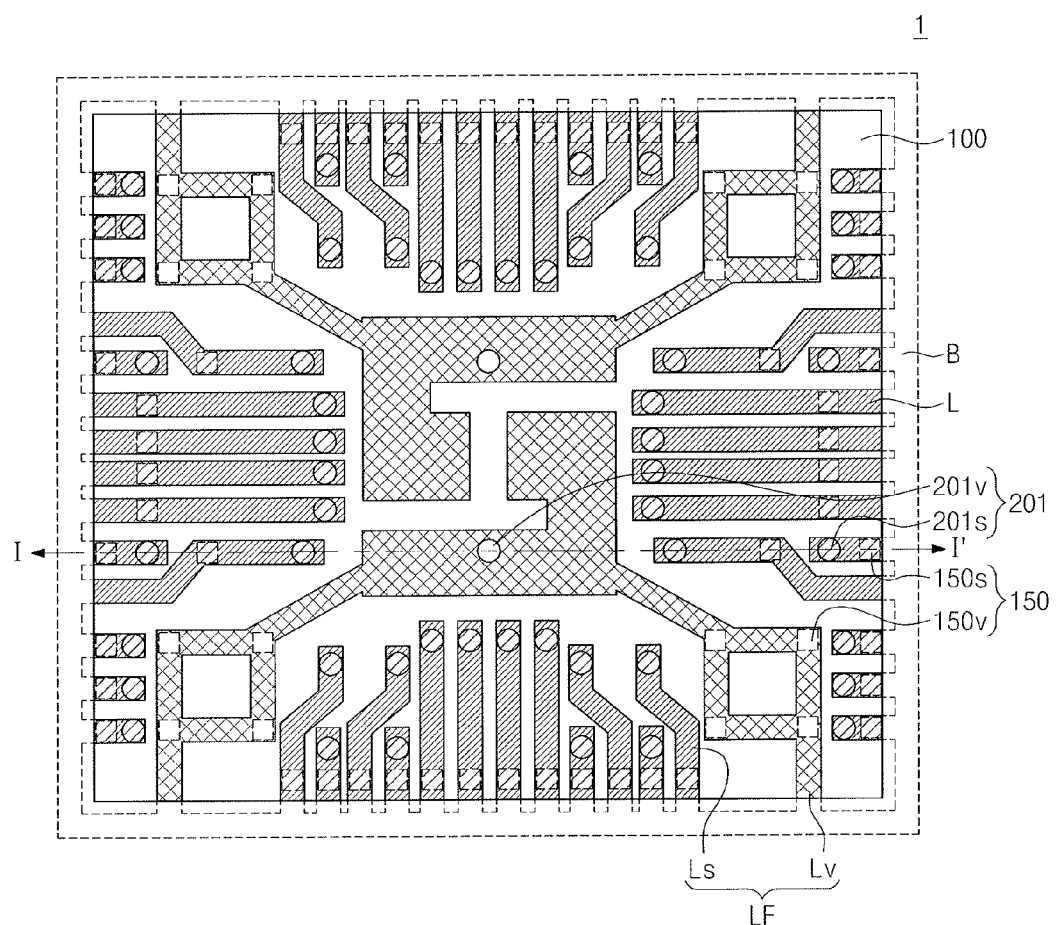
Figure 8B:
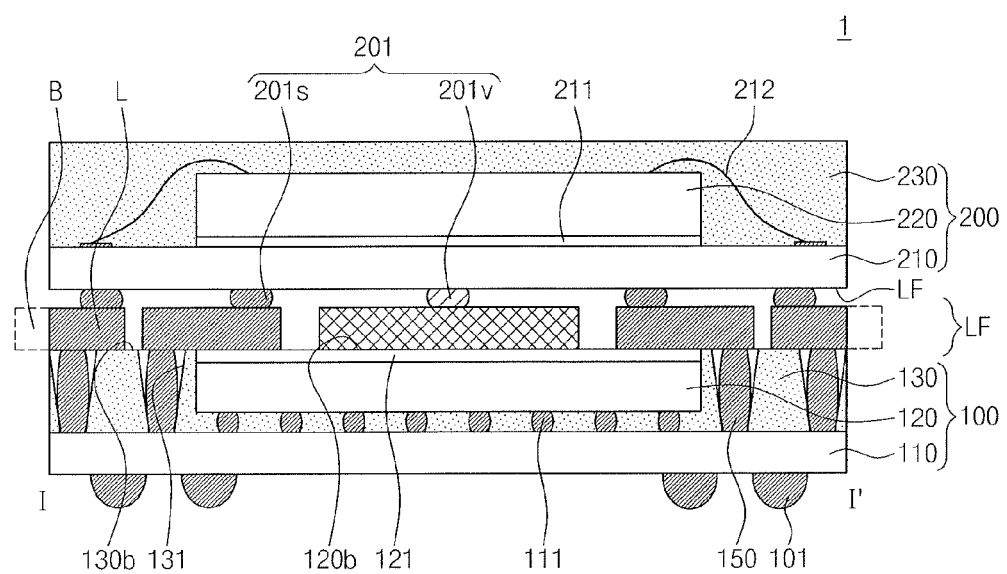

FIGS. 7A and 8A are plan views of stages in a manufacturing process of a semiconductor package according to an embodiment. FIG. 7B is a sectional view taken along line I-I' of FIG. 7A, and FIG. 8B is a sectional view taken along line I-I' of FIG. 8A. Hereinafter, overlapping contents described above are omitted.

Referring to FIGS. 7A and 7B, a lead plate LP may be disposed on the lower package 100. The lower package 100 may include the lower substrate 110, the lower semiconductor chip 120, and the lower molding layer 130. The bumps 150 may be disposed on the lower substrate 110 to surround the lower semiconductor chip 120. For example, the lower molding layer 130 may be formed on the lower substrate 110 to cover a sidewall of the lower semiconductor chip 120 and expose the upper surface 120b. Openings 131 may be formed in the lower molding layer 130 to expose the lower substrate 110. Then, the bumps 150 may be respectively formed in the openings 131. The bumps 150 may not be electrically connected to each other by, as the lower molding layer 130 separates therebetween. In another example, the formation of the bumps 150, the formation of the lower molding layer 130, and the arrangement of the lead plate LP may be performed sequentially. In yet another example, the lower molding layer 130 may be formed after the lead plate LP is disposed.

The lead plate LP may include lead parts L and a connection bar B. The connection bar B is provided at an edge area of the lead plate LP (FIG. 7A), and may be connected to each of the lead parts L. The connection bar B may be provided at an outer part Ls of the lead parts L. During an arrangement process of the lead plate LP, the connection bar B may fix the lead parts L physically. As the lead plate LP includes the connection bar B, the lead parts L may be easily arranged on the lower package 100. Additionally, the connection bar B may prevent damages to the lead parts L, e.g., bending or flexing. The lead parts L may be respectively connected to the bumps 150.

Referring to FIGS. 8A and 8B, when the connection bar B is removed from the lead parts L, the lead frame LF may be formed. The removal of the connection bar B may be performed through a trimming process. The upper package 200 may be disposed on the lead frame LF. The upper package 200 may include the upper substrate 210, the upper semiconductor chip 220, and the upper molding layer 230. Connection terminals 201 may be provided on the lower surface of the upper substrate 210. The connection terminals 201 may be connected to the lead parts L. For example, the connection terminal 201v for power supply may be electrically connected to the lead Lv for power supply, and the connection terminal 201s for signal transmission may be electrically connected to the lead part Ls for signal transmission.

An order in which the lower package 100 and the upper package 200 are disposed on the lead plate LP may be different from the above. For example, after the upper package 200 is disposed on the upper surface of the lead plate LP, the lower package 100 may be disposed on the lower surface of the lead plate LP. According to the embodiment described so far, manufacturing of the semiconductor package 1 is complete.

Figure 9:
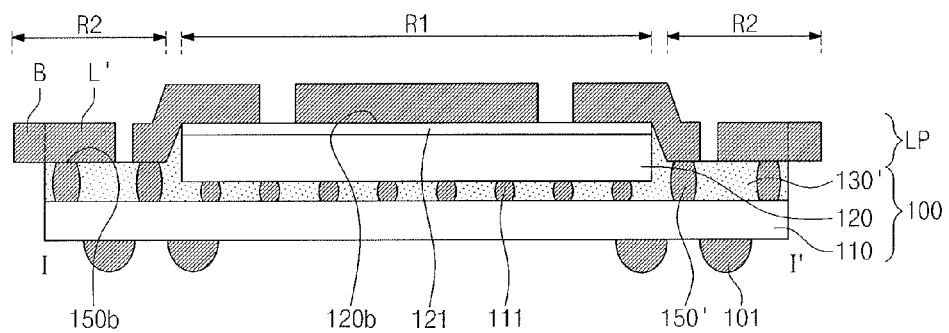
FIGS. 9 and 10 illustrate sectional views of stages in a manufacturing process of a semiconductor package according to another embodiment.
Figure 10:
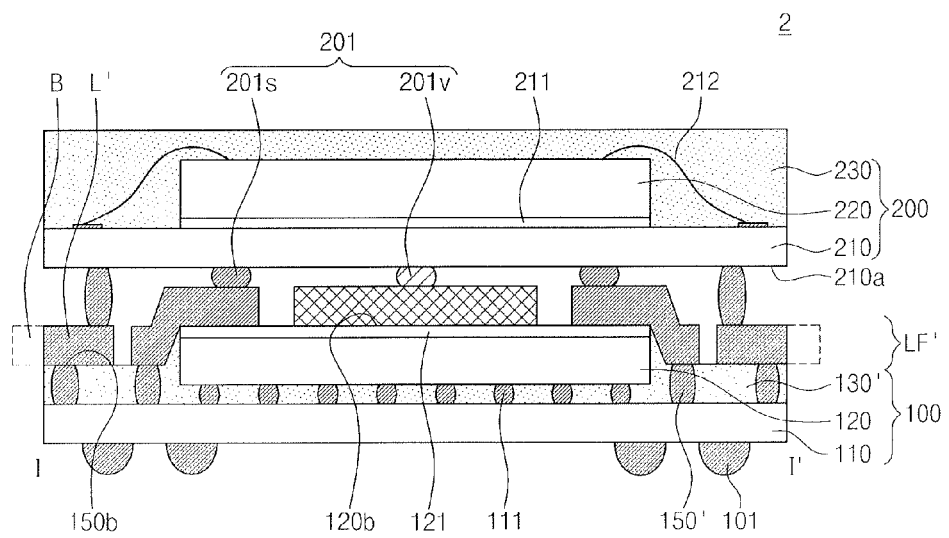

FIGS. 9 and 10 are sectional views illustrating stages in a manufacturing process of a semiconductor package according to another embodiment. Hereinafter, overlapping contents described above are omitted.

Referring to FIGS. 7A and 9 together, the lead plate LP may be disposed on the lower package 100. The lead plate LP may include lead parts L' and the connection bar B. However, the lead plate LP of an edge area R2 may be further recessed than the lead plate LP of the core area R1. For example, a lower surface of the lead plate LP' in the edge area R2 may be disposed at a different level, i.e., lower, than a lower surface of the lead plate LP in the core area R1. The lead plate LP in the core area R1 may be disposed on the lower semiconductor chip 120, and the lead plate LP of the edge area R2 may be disposed on the bumps 150'. The lower surface of the lead plate LP of the edge area R2 may contact the bumps 150'. The lead plate LP on the bumps 150 may be further recessed toward the lower substrate 110 than the lead plate LP on the lower semiconductor chip 120. During an arrangement process of the lead plate LP, the connection bar B may fix the lead parts L physically.

Referring to FIGS. 8A and 10 together, when the connection bar B is removed from the lead parts L', the lead frame LF' may be formed. The upper package 200 may be disposed on the lead frame LF'. The arrangement of the upper package 200 may be performed through the same method described with FIGS. 8A and 8B. For example, the connection terminals 201 may be connected to the lead parts L'. The lead frame LF' on the bumps 15'0 may be further recessed toward the lower substrate 110 than the lead frame LF' on the lower semiconductor chip 120. An order in which the lower package 100 and the upper package 200 are disposed on the lead frame LF' may be different from the above. For example, after the upper package 200 is disposed on the upper surface of the lead frame LF', the lower package 100 may be disposed on the lower surface of the lead frame LF'. According to the embodiment described so far, manufacturing of the semiconductor package 2 is complete. In another example, a passive device unit or a heat transfer unit may be further disposed between the lower semiconductor chip 120 and the lead frame LF' or between the lead frame LF' and the upper substrate 210.

Figure 11:
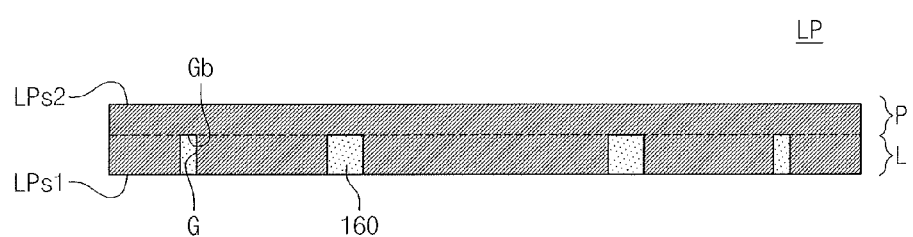
FIGS. 11 to 14 illustrate sectional views of stages in a method of manufacturing a semiconductor package according to another embodiment.
Figure 14:
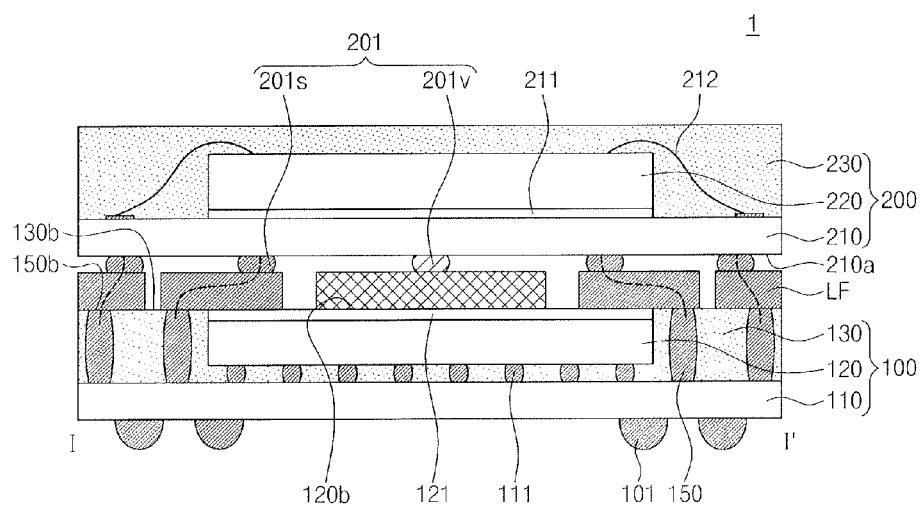

FIGS. 11 and 14 are sectional views of stages in a method of manufacturing a semiconductor package according to another embodiment. Hereinafter, overlapping contents described above are omitted.

Referring to FIG. 11, a lead plate LP including a groove G may be prepared. The lead plate LP may include a first surface LPs1 and a second surface LPs2 facing each other. One of the first surface LPs1 and the second surface LPs2 is an upper surface and the other one is a lower surface. The lead plate LP may include metal. e.g. copper or aluminum. The groove G may be formed on the first surface LPs1 of the lead plate LP through an etching process. Lead parts L and plate parts P may be defined by the groove G. The lead parts L may be spaced apart from each other side by side by the groove G. The groove G may not be formed on the plate part P. The plate part P is a portion of the lead plate LP extending between the surface having the same level as the bottom surface Gb of the groove G and the second surface LPs2. The lead parts L are portions of the lead plate LP extending between the surface having the same level as the bottom surface Gb of the groove G and the first surface LPs1. The plate part P may be connected to the lead parts L. The groove G may be filled with insulating patterns 160. The insulating patterns 160 may include resin. In another example, the insulating patterns 160 may not be formed.

Figure 12:
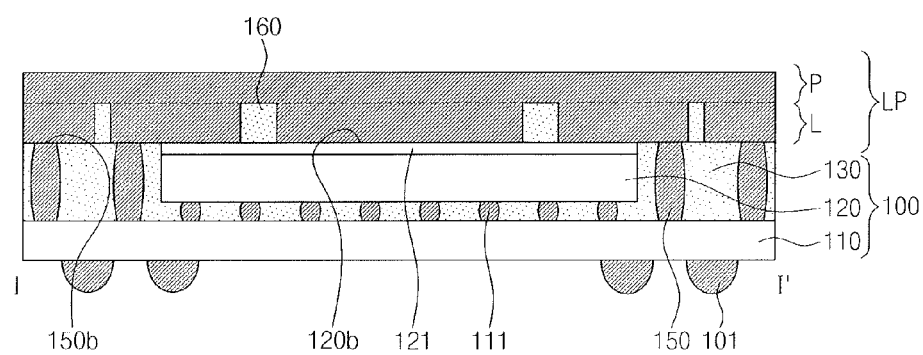

Referring to FIG. 12, the lead plate LP may be disposed on the lower package 100 in order to allow the lead parts L to face the lower package 100. The external terminals 101 may be provided on a lower surface of the lower substrate 110. The bumps 150 may be disposed on the lower substrate 110 to surround the lower semiconductor chip 120. The bumps 150 may be surrounded by the lower molding layer 130. The lower molding layer 130 may not cover the upper surface 120b of the lower semiconductor chip 120. The lead plate LP may be disposed on the lower semiconductor chip 120 and the bumps 150. The lower substrate 110, the external connection terminals 201, the lead parts L, the lower semiconductor chip 120, the bumps 150, and the lower molding layer 130 may be substantially identical to those described with reference to FIGS. 1A to 1B.

The first surface LPs1 of the lead plate LP may face the lower package 100. The lead parts L may contact the bumps 150. At this point, the plate part P may fix the lead parts L physically. As the lead plate LP includes the plate part P, the lead parts L may be easily arranged on the lower package 100. Additionally, the plate parts P may prevent damages to the lead parts L, e.g., bending or flexing. In another example, the lead plate LP may further include the connection bar B (described in FIGS. 7A and 7B) at the outer part. Accordingly, the lead parts L are more easily arranged on the lower package 100 and damage to the lead parts L is further prevented.

Figure 13:
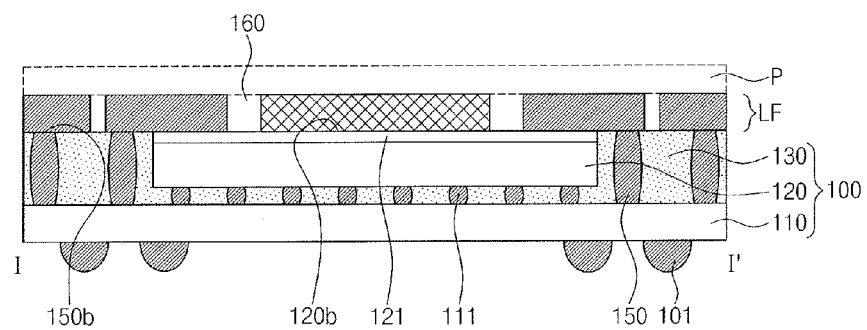

Referring to FIG. 13, a planarization process is performed on the second surface LPs2 of the lead plate LP, so that the plate part P may be removed. The planarization process is performed until the insulating patterns 160 are exposed, so that the lead parts L may be separated from each other. The planarization process may be performed by a chemical mechanical polishing or etching process. The insulating patterns 160 may protect the lower package 100 during the planarization process. Through the planarization process, the lead frame LF may be manufactured. Then, the insulating patterns 160 may be removed.

Referring to FIG. 14, the upper package 200 may be disposed on the lead frame LF. The upper package 200 includes the upper substrate 210, the upper semiconductor chip 220, and the upper molding layer 230. The connection terminals 201 may be connected to the lead frame LF. Accordingly, manufacturing of the semiconductor package 1 is complete.

Figure 15:
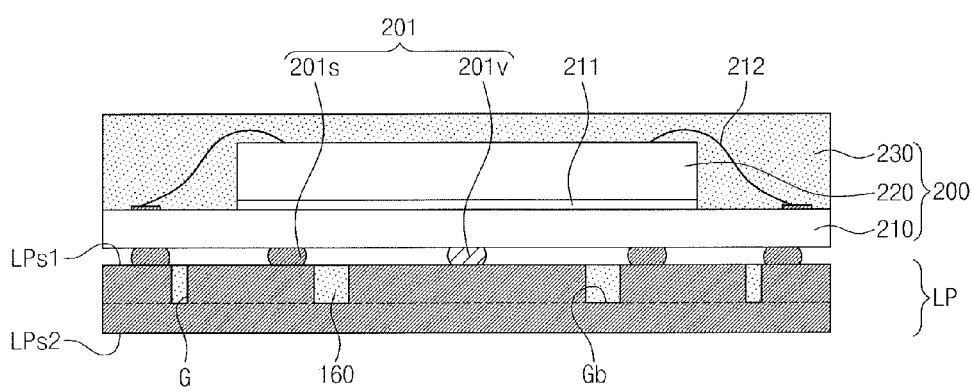
FIGS. 15 to 17 illustrate sectional views of stages in a manufacturing process of a semiconductor package according to another embodiment.
Figure 17:
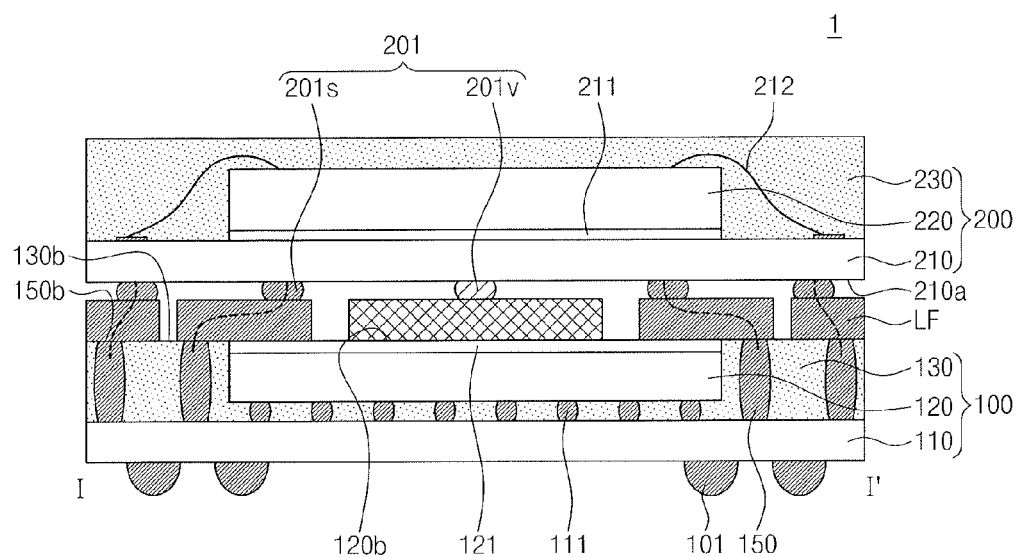

FIGS. 15 and 17 are sectional views of stages in a method of manufacturing a semiconductor package according to another embodiment. Hereinafter, overlapping contents described above are omitted.

Referring to FIG. 15, the lead plate LP may be provided on the lower surface of the upper package 200. The lead plate LP may be manufactured through the same method described with reference to FIG. 11. The upper package 200 includes the upper substrate 210, the upper semiconductor chip 220, and the upper molding layer 230. The lead plate LP may be disposed on the lower surface of the lower substrate 110 in order to allow the lead parts L to face the lower substrate 110. The lead parts L may contact the connection terminals 201 disposed on the lower surface of the lower substrate 110. During an arrangement process of the lead plate LP, the plate part P may fix the lead parts L physically.

Figure 16:
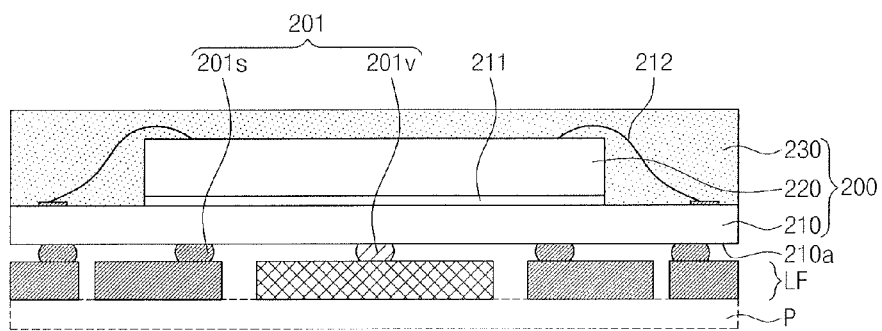

Referring to FIG. 16, a planarization process is performed on the second surface LPs2 of the lead plate LP, so that the plate part P may be removed. The planarization process is performed until the insulating patterns 160 are exposed, so that the lead parts L may be separated from each other. Then, the insulating patterns 160 may be removed. In another example, the insulating patterns 160 may be omitted. Accordingly, the lead frame LF may be manufactured.

Referring to FIG. 17, the lower package 100 may be disposed on the lead frame LF. The lower package 100 includes the lower substrate 110, the lower semiconductor chip 120, and the lower molding layer 130. The bumps 150 may be connected to the lead frame LF.

Figure 18:
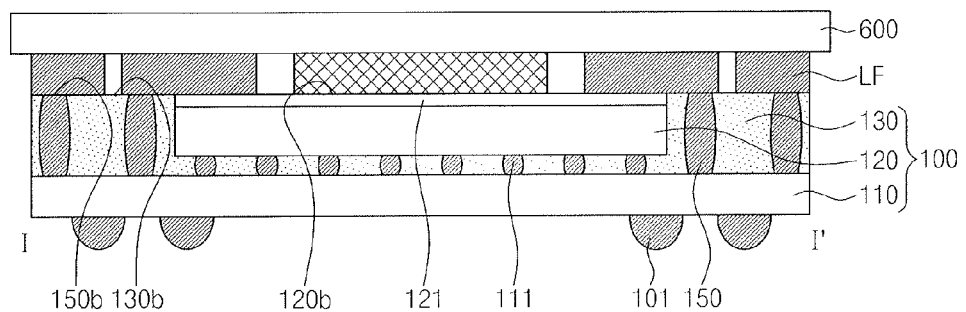
FIGS. 18 and 19 illustrate sectional views of stages in a manufacturing process of a semiconductor package according to another embodiment.
Figure 19:
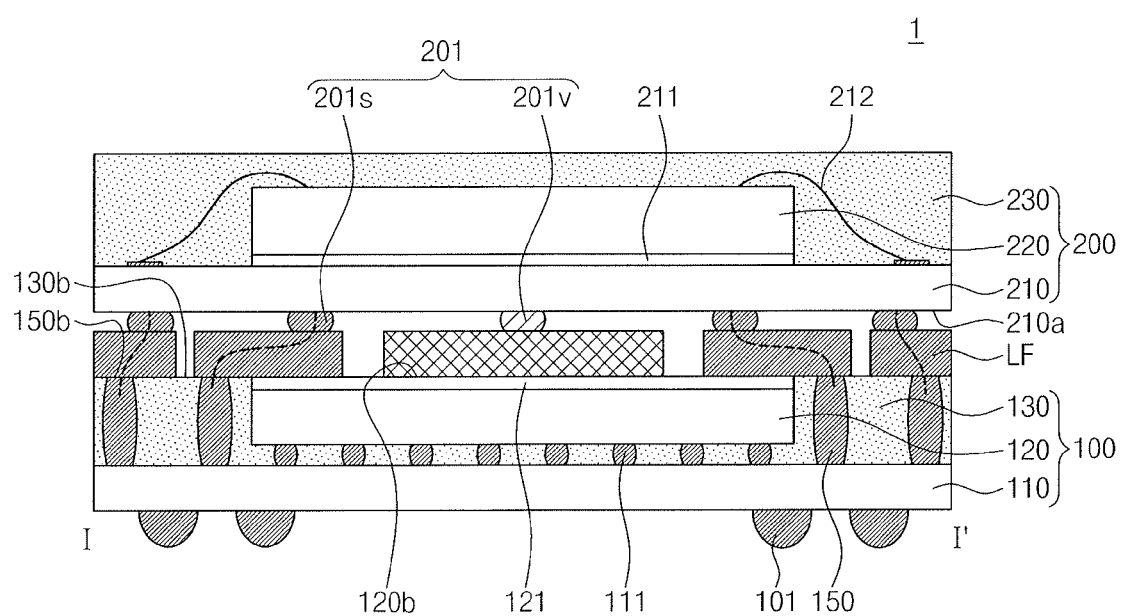

FIGS. 18 and 19 are sectional views of stages in a method of manufacturing a semiconductor package according to another embodiment. Hereinafter, overlapping contents described above are omitted.

Referring to FIG. 18, the lead frame LF may be disposed on the lower package 100. At this point, the lead frame LF including an adhesive part 600 attached thereto may be used. For example, the adhesive part 600 may be attached on the upper surface of the lead frame LF. At this point, an adhesive tape may be used as the adhesive part 600. The lead frame LF may be identical to that described with reference to FIGS. 1A and 1B. The lead frame LF may be disposed on the lower semiconductor chip 120 and the bumps 150 in order to allow the lower surface of the lead frame LF to face the lower package 100. During an arrangement process of the lead frame LF, the lead parts L may be fixed by the adhesive part 600. Accordingly, the lead parts L are more easily arranged on the lower package 100. Additionally, during an arrangement process of the lead frame LF, the damage of the lead parts L may be further prevented. The lead frame LF may be electrically connected to the bumps 150 and may be thermally connected to the lower semiconductor chip 120. The lower semiconductor chip 120 may further include a heat transfer material layer 121 thereon. Then, the adhesive part 600 may be removed. For example, the adhesive part 600 may be removed through a grinding or etching process. The lower molding layer 130 may be formed before or after the arrangement of the lead frame LF.

Referring to FIG. 19, the upper package 200 may be disposed on the lead frame LF. The connection terminals 201 may be connected to the lead frame LF. Accordingly, the upper package 200 may be electrically connected to the lower package 100 and the external terminals 101 through the lead frame LF. An order in which the lower package 100 and the upper package 200 are disposed on the lead frame LF may be different from the above. For example, after the upper package 200 is disposed on the upper surface of the lead frame LF, the lower package 100 may be disposed on the lower surface of the lead frame LF. At this point, the lead frame LF including the adhesive part 600 attached thereto may be used. According to the embodiment described so far, the semiconductor package 1 is manufactured.

<Application Example>

Figure 20:
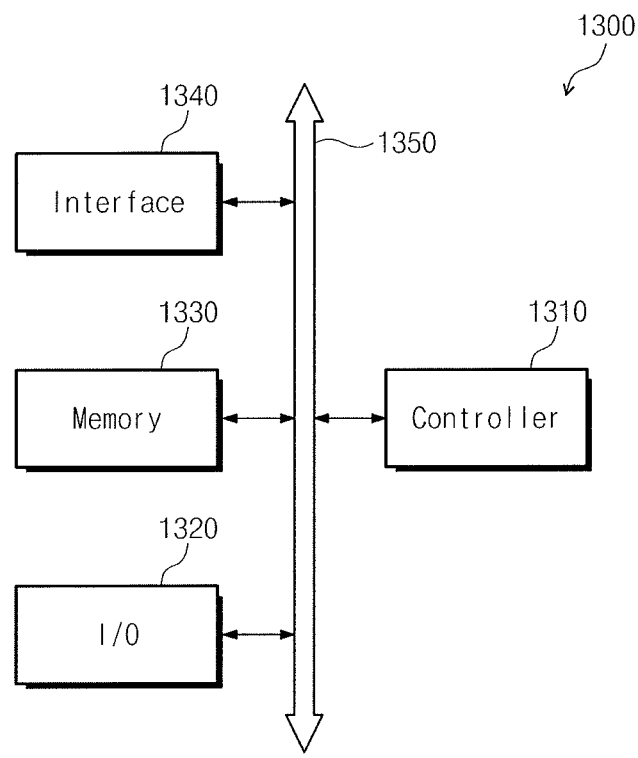
FIG. 20 illustrates a block diagram of an electronic device including a semiconductor package according to an embodiment.
Figure 21:
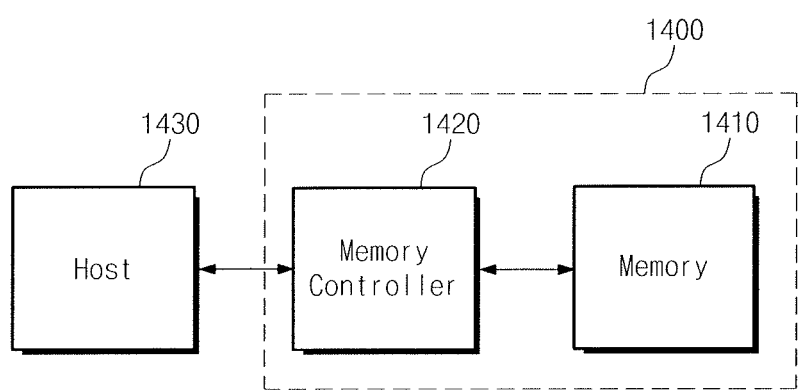
FIG. 21 illustrates a block diagram of a memory system including a semiconductor package according to an embodiment.

FIG. 20 is a block diagram of an electronic device including a semiconductor package according to an embodiment. FIG. 21 is a block diagram of a memory system including a semiconductor package according to an embodiment.

Referring to FIG. 20, an electronic system 1300 may include a controller 1310, an input/output (I/O) device 1320, and a memory device 1330. The controller 1310, the input/output device 1320, and the memory device 1330 may be connected to each other through a bus 1350. The bus 1350 may be a path through which data transfers. For example, the controller 1310 may include, e.g., at least one of a microprocessor, a digital signal processor, a microcontroller, and a logic device performing same functions. The controller 1310 and the memory device 1330 may include semiconductor packages 1 and 2 according to embodiments. The input/output device 1320 may include at least one of, e.g., a keypad, a keyboard, and a display device.

The memory device 1330 is a device storing data. The memory device 1330 may store data and/or commands executed by the controller 1310. The memory device 1330 may include, e.g., a volatile memory device and/or a non-volatile memory device. Or, the memory device 1330 may include flash memory. For example, a flash memory may be mounted in an information processing system, e.g., a mobile device or a desktop computer. Such a flash memory may be configured with a semiconductor disk device (SSD). In this case, the electronic system 1300 may stably store a large amount of data in the flash memory system. The electronic system 1300 may further include an interface 1340 for transmitting data to a communication network or receiving data from a communication network. The interface 1340 may be in a wired/wireless form. For example, the interface 1340 may include an antenna or a wired/wireless transceiver. Moreover, although not shown in the drawings, it is apparent to those skilled in the art that the electronic system 1300 may further include, e.g., an application chipset, a camera image processor (CIS), and an input/output device.

The electronic system 1300 may be realized with e.g., a mobile system, a personal computer, an industrial computer, or a logic system performing various functions. For example, the mobile system may be one of a personal digital assistant (PDA), a portable computer, a web tablet, a mobile phone, a wireless phone, a laptop computer, a memory card a digital music system, and an information transmitting/receiving system. When the electronic system 1300 is equipment for performing a wireless communication, it may be used for a communication interface protocol such as the third communication system, e.g., Code Division Multiple Access (CDMA), Global System for Mobile Communications (GSM), North American Digital Communications (NADC), enhanced time-division multiple-access (E-TDMA), Wideband Code Division Multiple Access (WCDMA), and CDMA2000.

Referring to FIG. 21, a memory card 1400 may include a non-volatile memory device 1410 and a memory controller 1420. The non-volatile memory device 1410 and the memory controller 1420 may store data or read stored data. The non-volatile memory device 1410 may include the semiconductor packages 1 and 2 according to embodiments. The memory controller 1420 may control the non-volatile memory device 1410 by reading stored data or storing data in response to a write/read request of a host.

According to an embodiment, a lead frame may be disposed between a lower package and an upper package. The lead frame may have a high thermal conductivity, so heat generated from a lower semiconductor chip may be released through the lead frame. Accordingly, the operating reliability of the lower semiconductor chip may be improved.

Further, connection terminals of the upper package may be electrically connected to the bumps of the lower substrate through the lead frame. The bumps may be connected to the terminals on the lower surface of the lower substrate through the lower substrate, and the arrangements and pitches of the connection terminals, the bumps, and the external terminals may vary. That is, as the lead frame connects the connection terminals of the upper package and the bumps of the lower substrate, the arrangement of the connection terminals and the bumps may not be restricted. Accordingly, a circuit pattern in the lower substrate and the upper substrate may be configured diversely.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a lower package including a lower substrate, a lower semiconductor chip, and a lower molding layer exposing an upper surface of the lower semiconductor chip;
   bumps on the lower substrate, the bumps being spaced apart from the lower semiconductor chip, and an uppermost surface of the bumps being substantially coplanar with an upper surface of the lower molding layer adjacent thereto;
   a lead frame on the lower semiconductor chip and on the bumps, the lead frame being electrically connected to the bumps; and an upper package on the lead frame and electrically connected to the lead frame,
wherein the lead frame includes a recessed portion that bends toward the lower substrate, a distance between the recessed portion of the lead frame on the bumps and the lower substrate being smaller than a distance between a portion of the lead frame on the lower semiconductor chip and the lower substrate.

2. The semiconductor package as claimed in claim 1, wherein the lead frame has a thermal conductivity of about 100 W/mk to about 10,000 W/mk.

3. The semiconductor package as claimed in claim 1, wherein the lead frame includes copper or aluminum.

4. The semiconductor package as claimed in claim 1, wherein the uppermost surface of the bumps has a lower level than an upper surface of the lower semiconductor chip.

5. The semiconductor package as claimed in claim 1, wherein:
the lead frame includes a lead part for power supply and a lead part for signal transmission;
the bumps include a bump for power supply and a bump for signal transmission; and
the lead part for power supply is electrically connected to the bump for power supply, and the lead part for signal transmission is electrically connected to the bump for signal transmission.

6. The semiconductor package as claimed in claim 1, wherein:
the upper package includes connection terminals on a lower surface thereof; and
the lower package includes external terminals on a lower surface of the lower substrate, the connection terminals of the upper package having a different arrangement than the external terminals of the lower package, as viewed from a two-dimensional top viewpoint.

7. The semiconductor package as claimed in claim 6, wherein the bumps have a non-overlapping relationship with the connection terminals and the external terminals along a vertical direction.

8. The semiconductor package as claimed in claim 6, wherein the bumps have a different pitch along a first direction than the connection terminals along the first direction, as viewed from the two-dimensional top viewpoint, the bumps being electrically connected to corresponding connection terminals along the first direction.

9. The semiconductor package as claimed in claim 1, further comprising a heat release part between the lower semiconductor chip and the lead frame.

10. The semiconductor package as claimed in claim 1, further comprising a support between the lead frame and the upper package.

11. The semiconductor package as claimed in claim 1, further comprising a passive device unit between the lower semiconductor chip and the lead frame, or between the lead frame and the upper semiconductor chip.

12. The semiconductor package as claimed in claim 1, wherein the lower molding layer is on an upper surface of the lower substrate, the lower molding layer filling between the bumps, and between the upper surface of the lower substrate and a lower surface of the lower semiconductor chip.

13. A semiconductor package, comprising:
a lower package including a lower substrate, a lower semiconductor chip, bumps spaced apart from the lower semiconductor chip, and a lower molding layer, the lower molding layer being on a surface of the lower substrate and filling between the bumps on the surface of the lower substrate, and exposing an upper surface of the lower semiconductor chip;
a lead frame on the lower semiconductor chip and on the bumps, the lead frame being electrically connected to the bumps; and
an upper package on the lead frame and electrically connected to the lead frame,
wherein:
the lead frame includes a lead part for power supply and a lead part for signal transmission,
the bumps include a bump for power supply and a bump for signal transmission, and
the lead part for power supply is electrically connected to the bump for power supply, and the lead part for signal transmission is electrically connected to the bump for signal transmission.

14. The semiconductor package as claimed in claim 13, wherein the lead frame includes copper or aluminum.

15. A semiconductor package, comprising:
a lower package including a lower substrate, a lower semiconductor chip, and a lower molding layer exposing an upper surface of the lower semiconductor chip;
bumps on the lower substrate, the bumps being spaced apart from the lower semiconductor chip;
a lead frame on the lower semiconductor chip and on the bumps, the lead frame including a recess that bends toward the lower substrate, and the lead frame being electrically connected to the bumps and having a thermal conductivity of about 100 W/mk to about 10,000 W/mk; and
an upper package on the lead frame and electrically connected to the lead frame, the upper package including connection terminals electrically connected to corresponding bumps via the lead frame,
wherein the connection terminals are spaced apart from the corresponding bumps along a first direction, a distance between two adjacent bumps in the first direction being different from a distance between two adjacent connection terminals in the first direction, the adjacent bumps and connection terminals being at a same side of the lower semiconductor chip.

16. The semiconductor package as claimed in claim 15, wherein the lead frame includes a first portion and a second portion peripheral to the first portion, a distance between a bottom surface of the first portion and a bottom of the lower substrate being larger than a distance between a bottom surface of the second portion and the bottom of the lower substrate.

17. The semiconductor package as claimed in claim 15, wherein an arrangement of the bumps in the first molding layer is different from an arrangement of external terminals on a bottom surface of the lower package, when viewed from a two-dimensional top viewpoint.

18. The semiconductor package as claimed in claim 1, wherein the lead frame is completely external to the lower molding layer.

19. The semiconductor package as claimed in claim 1, wherein the lead frame includes a first portion and a second portion, the first and second portions of the lead frame being electrically separated from each other to be connected to different types of bumps.

20. The semiconductor package as claimed in claim 15, wherein:
the lead frame includes a lead part for power supply and a lead part for signal transmission;

the bumps include a bump for power supply and a bump for signal transmission; and the lead part for power supply is electrically connected to the bump for power supply, and the lead part for signal transmission is electrically connected to the bump for signal transmission.

\* \* \* \* \*